US012613548B2

(12) United States Patent  (10) Patent No.: US 12,613,548 B2

Pidwerbecki et al.  (45) Date of Patent: Apr. 28, 2026

---

(54) COMPOSITE MATERIALS FOR ELECTRONIC DEVICE CHASSIS AND RELATED METHODS

(71) Applicant: Intel Corporation, Santa Clara, CA (US)

(72) Inventors: David Pidwerbecki, Portland, OR (US); Arvind S, Bangalore (IN); Jeff Ku, Taipei (TW); Juha Tapani Paavola, Hillsboro, OR (US); Prakash Kurma Raju, Bangalore (IN); Amruta Krishnakumar Ranade, Bengaluru (IN); Sudheera Sudhakar, Bangalore (IN); Mousumi Deka, Bangalore (IN); Snehal Chaudhari, Bangalore (IN); Akarsha R. Kadadevaramath, Tumkur (IN)

(73) Assignee: Intel Corporation, Santa Clara, CA (US)

( * ) Notice: Subject to any disclaimer, the term of this patent is extended or adjusted under 35 U.S.C. 154(b) by 382 days.

(21) Appl. No.: 18/129,524

(22) Filed: Mar. 31, 2023

(65) Prior Publication Data

US 2024/0210988 A1 Jun. 27, 2024

Related U.S. Application Data

(60) Provisional application No. 63/476,860, filed on Dec. 22, 2022.

(51) Int. Cl.
| | |
|---|---|
| *G06F 1/16* | (2006.01) |
| *B32B 5/02* | (2006.01) |

(Continued)

(52) U.S. Cl.
CPC .............. *G06F 1/1615* (2013.01); *B32B 5/02* (2013.01); *B32B 5/26* (2013.01); *C23C 14/205* (2013.01);

(Continued)

(58) Field of Classification Search
None
See application file for complete search history.

(56) References Cited

U.S. PATENT DOCUMENTS

2010/0183869 A1* 7/2010 Lin ........................ C25D 11/04
420/544

FOREIGN PATENT DOCUMENTS

| | | | | |
|---|---|---|---|---|
| WO | WO-0044557 A1 * | 8/2000 | ............. | C25D 9/12 |
| WO | WO-0070123 A1 * | 11/2000 | ............. | C23C 22/08 |

(Continued)

OTHER PUBLICATIONS

Hao et al., "Enhanced both in-plane and through-thickness thermal conductivity of carbon fiber/epoxy composites by fabricating high thermal conductive coaxial PAN/PBO carbon fibers," Composites Part B: Engineering, vol. 229, Jan. 15, 2022, 109468, 7 pages.

*Primary Examiner* — Jennifer A Boyd

(74) *Attorney, Agent, or Firm* — Hanley, Flight & Zimmerman, LLC

(57) ABSTRACT

Systems, apparatus, articles of manufacture, and methods are disclosed related to composite materials for electronic device chassis. An example electronic device includes a chassis including a layer of a magnesium alloy or a layer of polyether ether ketone and carbon fiber reinforced plastic and an anodized aluminum coating.

11 Claims, 4 Drawing Sheets

(51) Int. Cl.

| | | |
|---|---|---|
| *B32B 5/26* | | (2006.01) |
| *C23C 14/20* | | (2006.01) |
| *C23C 14/35* | | (2006.01) |
| *C23C 16/06* | | (2006.01) |

(52) U.S. Cl.

CPC .............. *C23C 14/35* (2013.01); *C23C 16/06* (2013.01); *B32B 2255/02* (2013.01); *B32B 2255/205* (2013.01); *B32B 2255/28* (2013.01); *B32B 2260/023* (2013.01); *B32B 2260/046* (2013.01); *B32B 2457/00* (2013.01)

(56) References Cited

FOREIGN PATENT DOCUMENTS

| WO | WO-03033772 | A1 | * | 4/2003 | ............... | C25D 7/00 |
|----|-------------|-----|---|--------|----------------|-----------|
| WO | WO-2016068838 | A1 | * | 5/2016 | ............... | C25D 7/00 |
| WO | WO-2016111493 | A1 | * | 7/2016 | ........... | H05K 9/0022 |
| WO | WO-2021154274 | A1 | * | 8/2021 | ................ | C25F 1/06 |
| WO | WO-2021177977 | A1 | * | 9/2021 | ............... | C23C 6/00 |

* cited by examiner

COMPOSITE MATERIALS FOR ELECTRONIC DEVICE CHASSIS AND RELATED METHODS

RELATED APPLICATION

This patent claims the benefit of U.S. Provisional Patent Application No. 63/476,860, which was filed on Dec. 22, 2022. U.S. Provisional Patent Application No. 63/476,860 is hereby incorporated herein by reference in its entirety. Priority to U.S. Provisional Patent Application No. 63/476, 860 is hereby claimed.

FIELD OF THE DISCLOSURE

This disclosure relates generally to composite materials and, more particularly, to composite materials for electronic device chassis and related methods.

BACKGROUND

Electronic devices such as laptops have chassis made of materials such as magnesium. Many electronic device chassis are painted.

Figure 1:
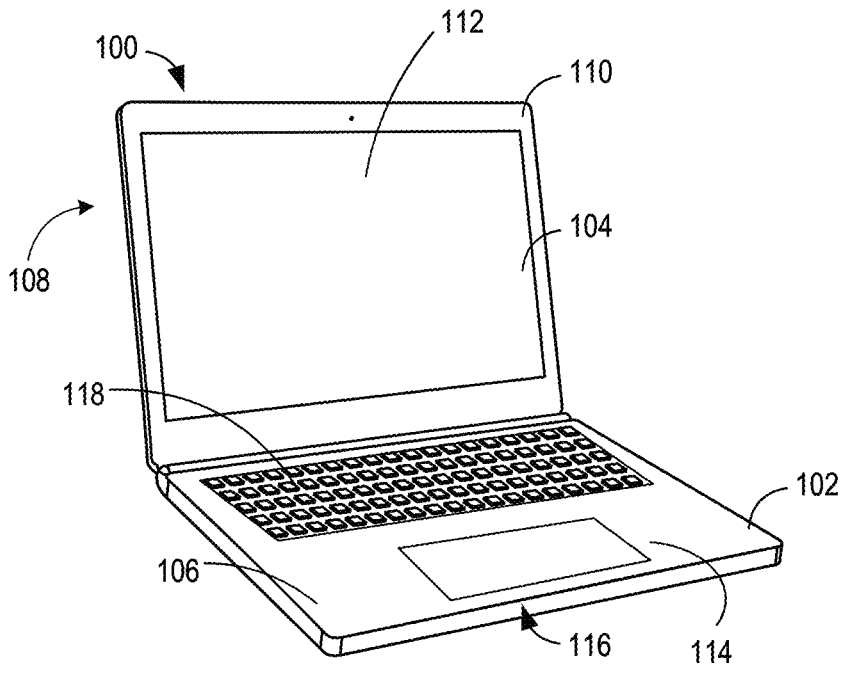
FIG. 1 is an illustration of an example electronic device having an example chassis.

In general, the same reference numbers will be used throughout the drawing(s) and accompanying written description to refer to the same or like parts. The figures are not necessarily to scale. Instead, the thickness of the layers or regions may be enlarged in the drawings. Although the figures show layers and regions with clean lines and boundaries, some or all these lines and/or boundaries may be idealized. In reality, the boundaries and/or lines may be unobservable, blended, and/or irregular.

DETAILED DESCRIPTION

Magnesium or a magnesium alloy may be used as a chassis material in electronic devices such as, laptop computer. For example, thin and light and gaming laptops may use magnesium as a suitable chassis material due to low weight and reasonable thermal conductivity. However, due to poor corrosion resistance of magnesium, typically chassis of magnesium are painted. However, painting the chassis compromising recyclability of the chassis, and the process is not sustainable.

Examples disclosed herein create a sustainable and energy efficient electronic devices (e.g., laptop computers) apply technology to reduce emissions across high-impact industries. For example, examples disclosed herein replace the painting of chassis and, instead, use an anodized finish on an aluminum layer coated on the magnesium chassis, which provides a premium chassis look and facilitates the end-of-life recycling process. Anodizing or anodization is a process that increases the thickness of a natural oxide layer on the surface of metals.

Another characteristic of electronic device chassis relates to the thermal conductivity of the chassis. The temperature of the surface of the chassis is a function of the chassis material. The material has a large impact on the cooling capability and the performance of the electronic device. For example, an aluminum chassis can easily overheat. In addition, carbon fibers and carbon fiber reinforced plastics (CFRP) may be used as chassis material due to their light weight and good structural properties. However, CFRPs have low thermal conductivity, which can lead to overheated areas. Overheated areas of the chassis are known as skin hotspots. Skin hotspot may affect operation of the electronic device and/or the user experience. In addition, CFRPs cannot be recycled when combined with a thermoset plastic such as epoxy in an electronic device chassis.

Examples disclosed herein utilize polyether ether ketone (PEEK) thermoplastic. In some examples, PEEK is combined with CFRP followed by one or more additional processes to make a PEEK and CFRP chassis a higher thermally conductive material and to enhance sustainability. Some examples disclosed herein also add an anodized metal premium look for the CFRP chassis such as, for example, an anodized aluminum layer.

FIG. 1 is an illustration of an example electronic device 100 having an example chassis 102. In the illustrated example, the electronic device 100 is a laptop computer. In other examples, the electronic device 100 is any type of electronic device that includes a chassis. Thus, examples disclosed herein relate to electronic devices of all types. The electronic device includes an example first panel 104 and an example second panel 106. The first panel 104 includes an example first cover 108 (e.g., A cover) and an example second cover 110 (e.g., B cover). In this example, the first panel 104 includes an example display 112 within the second cover 110 such that the second cover 110 is a portion of the chassis 102 around the display 112. The first cover 108 of the first panel 104 is on the opposite side of the first panel 104 as the display 112. The second panel 106 includes an example third cover 114 (e.g., C cover) and an example fourth cover 116 (e.g., D cover). In this example, the third cover 114 includes and/or surrounds an example keyboard 118. The fourth cover 116 of the second panel 106 is on the opposite side of the second panel 106 as the keyboard 118. The chassis 102 may include magnesium, a magnesium alloy, aluminum, PEEK and CFRP, and/or other composition of materials as disclosed herein.

Some die-cast metals that may be used for a chassis cannot be anodized directly due to high silicon content. If anodized, the surface of such metals turns dark gray and results in an unacceptable finish. For example, direct anodization of a magnesium chassis leads to a poor surface finish and non-premium look. Magnesium is highly reactive and when introduced to electrolytes, the magnesium reaches very high temperatures that complicate the anodization process. In some examples, additives may be used to achieve the premium finish, the additives add cost and are challenging to manage.

In another example, stamped aluminum with plastic bonding may be used for a D cover of an electronic device.

However, for an A cover and a C cover, the stamped aluminum with plastic leads to unrefined finishing on edge and corners.

The disadvantages of prior designs include heavier weight, higher cost compared to magnesium, more complicated mechanical design, and increased Z height. For example, a 0.8 millimeter (mm) thick layer of aluminum attached to a 1.1 mm magnesium frame increases the total thickness of a C cover up to 2 mm and adds up to 110 grams to the weight of the third cover 114.

Figure 2:
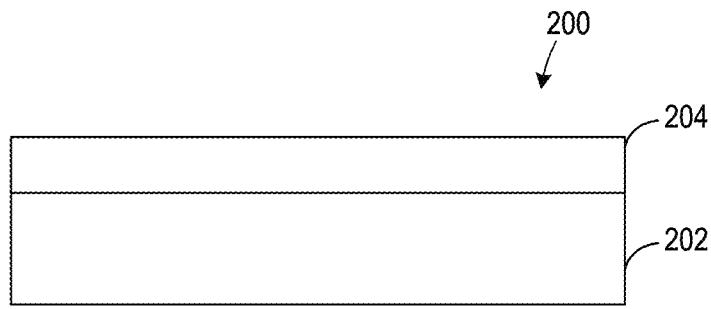
FIG. 2 is a schematic illustration of example layers of the chassis of FIG. 1.

The examples disclosed herein overcome the deficiencies of the prior processes by coating a die cast metal (e.g., magnesium) used to form the chassis 102 with a thin layer of aluminum and then anodizing the layer of aluminum. Further, examples disclosed herein replace the painting process of a magnesium chassis. FIG. 2 illustrates an example layering 200 of materials that may form the chassis 102 of FIG. 1. The example layering 200 includes a first layer, base layer, or metal layer 202. In some examples, the first layer 202 is magnesium, magnesium alloy, or other material. Thus, in this disclosure, the first layer 202 may also be referred to as the magnesium layer 202. The example layering 200 also includes a second layer or aluminum layer 204. In some examples, the second layer 204 includes another material.

Anodization on the aluminum layer 204 coated on the magnesium layer 202 forms a very hard and scratch-resistant layer of aluminum oxide is formed. The chassis 102 retains the surface strength and corrosion resistance and has high machining capability. In addition, any color can be obtained through anodizing surface treatment instead of painting. By avoiding painting, the process of recyclability avoids non-sustainable methods of paint removal. Paint removal requires chemical processing at specialized facilities. Removal of paint is a two-step process. First is physical scrapping the paint, second step is dipping the part in an alkaline solution to completely remove the paint deposited in the material. The paint removal process is challenging, unsafe, consumes a lot of caustic chemicals, uses a lot of energy and generates poisonous gases. This also leads to a decrease in material yield. Therefore, the overall process of paint removal is a non-sustainable process of recycling and reusing the parts. Thus, another advantage is that anodization on the aluminum layer 204 of the magnesium layer 204 makes the chassis 102 fully recyclable.

Another advantage of example disclosed herein includes use of the anodized aluminum layer 204 for the first cover 108, the second cover 110, the third cover 114, and/or the fourth cover 116. For example, if the electronic device 100 such as, for example, a 16-inch gaming system uses the anodized aluminum layer 204 coated on the magnesium layer 202 as the chassis 102, the total weight of the electronic device 100 could reduce by 200 grams or more, which is more than 10% of the total weight of the electronic device 100 where, in this example, the electronic device 100 has a weight of 2.2 kilograms.

In examples disclosed herein, the anodized surface will have a matte finish, non-reflective surface. A painted surface will chip off when slightly scrapped. An anodized surface is porous and embedded on the material structure (i.e., within the aluminum layer 204) and does not peel off. In addition, the surface strength of the anodized surface is relatively harder and more durable than that of a directly painted chassis surface.

Figure 3:
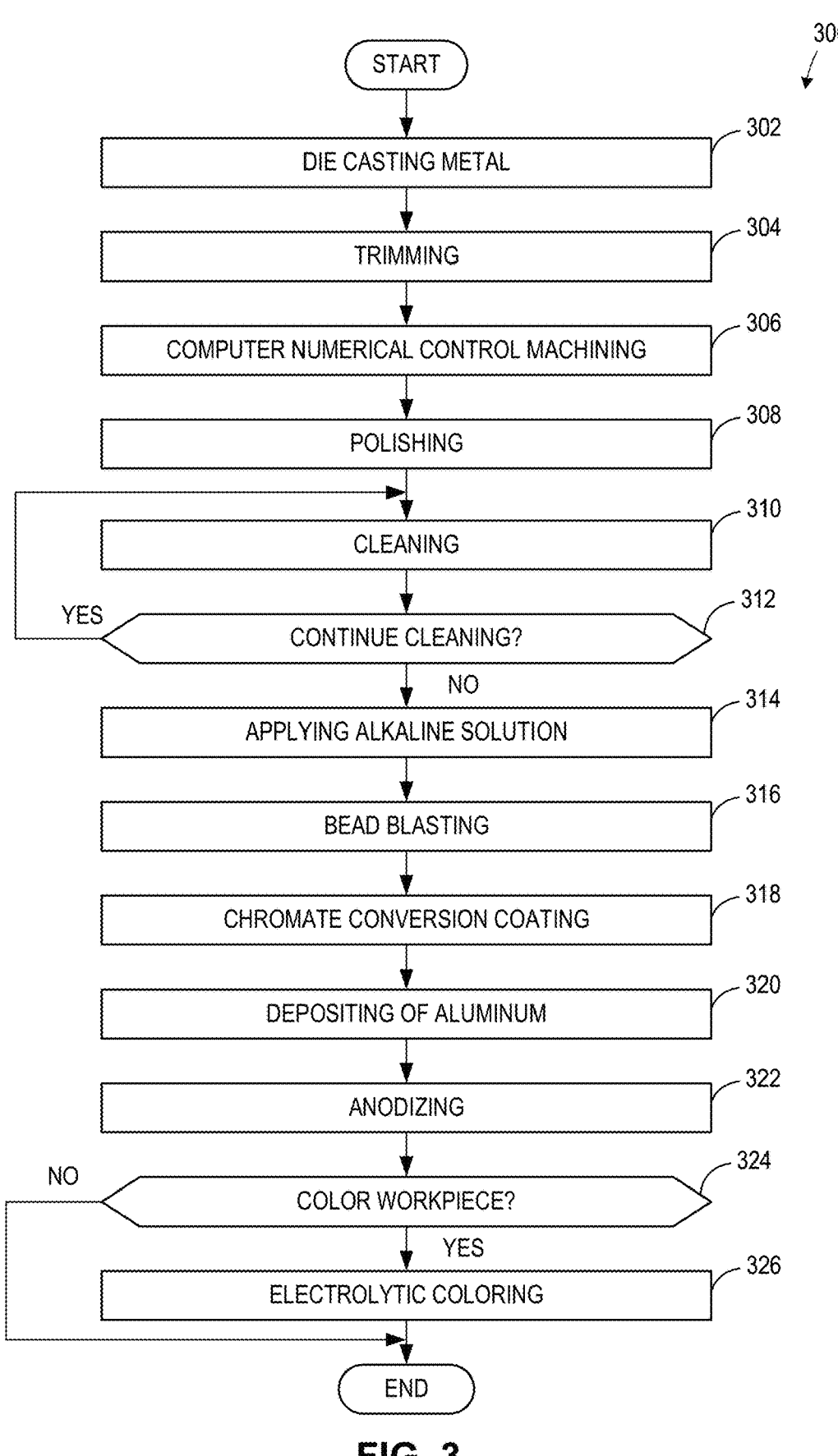
FIG. 3 is a flow chart of an example process of producing an electronic device with the example layers of FIG. 2.

FIG. 3 is a flow chart of an example process 300 of producing or manufacturing an electronic device including the example layering 200 of FIG. 2. The example process

300 includes die casting a raw material such as, for example, a metal (block 302). The metal may include for example, magnesium or a magnesium alloy. In some examples, the die casting includes pouring a molten magnesium alloy into the pre-set die to form a workpiece. After the workpiece is cooled, the process 300 includes trimming the workpiece (block 304). Trimming is performed to remove extra material.

The process 300 includes computer numerical control (CNC) machining of the workpiece (block 306). CNC machining includes the automated control of machines and/or machine parts by a computer to achieve a desired or target shape and specifications of the workpiece. Example machines and/or machine parts include saws, drills, lathes, cutters, mills, spindles, presses, grinders, routers, three-dimensional printers, lasers, and/or other motorized and/or maneuverable tools, platforms, etc. CNC machining is performed to achieve desired or target design tolerances.

The process 300 includes polishing the workpiece (block 308). The workpiece is polished to achieve a desired or target finish. The process 300 also includes cleansing the workpiece (block 310). The workpiece is cleaned to remove mold reagents. The process 300 includes determining if the workpiece is to be cleaned again (block 312). For example, a controller such as, for example, the processing platform 600 of FIG. 6, which includes programmable circuitry structured to execute, instantiate, and/or perform machine readable instructions determines if the workpiece is to be cleaned again. The workpiece may be repeatedly cleaned to prepare the workpiece for further processing. If the workpiece is to be cleaned again (block 312: YES), the process 300 includes cleaning the workpiece (block 310). If the workpiece is not to be cleaned again (block 312: NO), the process 300 proceeds to applying an alkaline solution (block 314). An alkaline solution is applied for increasing adhesion of an aluminum coating.

The process 300 includes bead blasting the workpiece (block 316). Bead blasting includes projecting media (e.g., bead-shaped media) at the surface of the workpiece. Bead blasting is used to smooth, shine, and clean the workpiece. In some examples, other shot blasting and/or media blasting techniques may be used including, for example, sandblasting, plastic abrasive blasting, etc.

The process 300 includes chromate conversion coating the workpiece (block 318). The chromate conversion coating is a chemical or electro-chemical treatment applied to the workpiece converts surface material of the workpiece into a thin adhering coating of an insoluble compound. In some examples, chromate conversion coating is applied on areas of the workpiece that require electrical conductivity and corrosion-resistance at the same time. In some examples, chromate conversion coating is applied on the entire workpiece. In some examples, a hex-free chromate conversion coating, which does not include hexavalent chromium compounds, is used. The hex-free chromate conversion coating is environmentally safe. The chromate conversion coating is applied to improve adherence of another material (e.g., the aluminum layer 204), as a decorative finish, for abrasion resistance, and/or to preserve or enhance electrical conductivity.

The process 300 also include depositing aluminum on the workpiece (block 320). In some examples the aluminum is deposited via a physical vapor deposition (PVD) processing including, for example, sputtering, magnetron sputtering, etc. In some examples, the workpiece is placed inside a PVD chamber for the deposition of the aluminum. During the depositing of the aluminum, the aluminum is evaporated and deposited as thin coatings on the surface of the workpiece. For example, the aluminum layer 204 is deposited on the magnesium layer 202. Due to the high temperature vacuum evaporation and condensation, the aluminum embeds into the porous structure of the magnesium. In examples disclosed herein, the PVD and/or a chemical vapor deposition (CVD) may be performed by a fluidized-bed technique. In some examples, the PVD technique does not require pretreatments, is safer than CVD due to absence of toxic precursors, and can run at lower temperatures. In some examples, coatings of complex geometries are possible with the PVD technique.

The process 300 includes anodizing the workpiece (block 322). Anodization increases the thickness of a natural oxide layer on the aluminum layer. Anodization leads to the formation of a premium and finished look and a very hard and scratch-resistant non-toxic aluminum-oxide layer. Anodization on aluminum uses no volatile organic compound, carrier resins, halogenated hydrocarbons, and/or hazardous waste. In some examples, the anodizing technology can be applied on recycled a magnesium chassis, and additives may be used to retain the mechanical properties of magnesium.

The process 300 includes determining if the workpiece is to be colored (block 324). For example, a controller such as, for example, the processing platform 600 of FIG. 6 determines whether to color the workpiece. If the workpiece is to be colored (block 324: YES), the process 300 includes electrolytic coloring of the workpiece (block 326). Electrolytic coloring includes the absorption of dyes, salts, or other pigments into the aluminum layer during an electrolytic process. In some examples, the workpiece is colored by dip coloring or integral coloring. If the workpiece is not to be colored (block 324: NO) or after coloring the workpiece (block 326), the process 300 ends.

Because the workpiece has no application of paints, the magnesium anodized part is 100% pure and 100% recyclable. The recycling process is less complex than with painted electronic device. For example, to remove pigment from the anodized surface, suitable adsorbents can be used from sustainable methods, such as, for example, groundwater waste. To remove the aluminum coating, the workpiece can be dipped in an alkaline solution.

In examples disclosed herein, there are material benefits compared to a painted magnesium chassis. For example, with respect to corrosion resistance, anodized aluminum on a magnesium chassis has good hardness, durability, and protection of structural integrity. With respect to material weight, aluminum anodized magnesium chassis, for example, has a density approximately 1.81 grams per cubic centimeter (g/cc) and does not add material weight compared to painted magnesium. In terms of yield strength, because the anodized aluminum and magnesium layer has, in some examples, a yield strength of approximately 160 MegaPascals (MPa).

In terms of cost, the cost of manufacturing painted magnesium chassis is higher because it includes many preprocessing and post-processing steps for painting. In addition, the cost of recycling a painted part is higher than that of an electronic device with a chassis of anodized aluminum and magnesium. Furthermore, anodized aluminum on magnesium chassis has lower cost owing to coating and anodization only. Recycling an electronic device with a chassis of anodized aluminum and magnesium is less costly, quicker, and has lesser material waste. Recycling painted magnesium chassis is costly, challenging and results in waste products such as tar, char, gaseous fuel vapors, waste of metal in paint stripping process. Anodized/colored anodized aluminum coated magnesium chassis is easy to recycle without generation of poisonous CO2 gases to the environment.

In some examples, anodized aluminum coated magnesium chassis has 0.1% higher thermal conductivity than a painted chassis. In some examples, the thermal conductivity of an anodized magnesium chassis is, for example, 72.7 Watts per meter-Kelvin (W/m-K).

Painted magnesium may have inconsistent appearance and can be scratched. Anodized magnesium chassis has color stability with pigments and gives a premium look. PVD aluminum coatings provide a premium material feeling only achievable by metal surfaces.

PVD aluminum coated/anodized parts have a potential to be, for example, a 1 mm thinner chassis. In some examples, painted magnesium is roughly 0.5 mm thicker per surface than the anodized magnesium chassis (considering a primer and three paint coats having a thickness of about 0.1 mm, the anodized aluminum chassis is about 0.005 mm thick aluminum and 0.002 mm oxide expansion).

Also, in examples disclosed herein, there are material benefits compared to a directly anodized magnesium chassis including for example, the corrosion resistance material weight, yield strength, heat dissipation and/or thermal conductivity benefits noted above with respected to painted magnesium chassis. In addition, directly anodized magnesium may have inconsistent appearance and may require many additives in an aqueous bath to achieve a desired aesthetic appearance. An anodized aluminum on magnesium chassis is non-toxic, water based, and environment friendly.

A benefit of examples disclosed herein is in achieving matching color on a bonded plastic on the outer surface of a metal chassis. For example, bonded plastic is used for radio frequency antenna plastics where metal cannot be used. The examples disclosed herein achieve anodized finish on the plastic bonding area as well as the chassis. Thus, in such examples, the plastic does not need painting or otherwise be left a different color. In some examples, an aluminum layer is deposited over a metal chassis cover that has a plastic (e.g., a polyphenylene sulfide (PPS) plastic) bonded. In this example, the process includes die casting the metal (e.g., block 302), trimming (e.g., block 304), polishing (e.g., block 308), cleaning (e.g., block 310), alkaline coating (e.g., block 314), depositing the aluminum (e.g., block 320), followed by laser etching the aluminum coating on a plastic area, bead blasting (e.g., block 316) and then anodizing the entire chassis (e.g., block 322).

An alternative example for achieving a matching color on a plastic portion includes die casting the metal (e.g., block 302), trimming (e.g., block 304), polishing (e.g., block 308), cleaning (e.g., block 310), alkaline coating (e.g., block 314), followed by masking the plastic area(s), depositing the aluminum (e.g., block 320), followed by non-conductive vacuum metallizing (NCVM), and then anodizing (e.g., block 322). NCVM gives a non-conductive metallic finish on plastics. The non-conductive property allows the transmission of radio frequencies.

Figure 4:
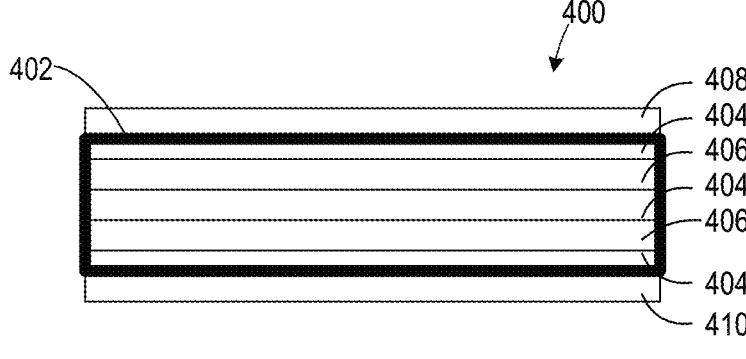
FIG. 4 is a schematic illustration of alternative example layers of the chassis of FIG. 1.

FIG. 4 is a schematic illustration of alternative example layers 400 of the chassis 102 of FIG. 1. The example layering 400 includes an example laminate layer 402. The laminate layer 402 includes a plurality of a stacked example thermoplastic film layers 404 and example reinforcement layers 406. In the illustrated example, the thermoplastic film layers 404 and reinforcement layers 406 alternate. In the illustrated example, there are three thermoplastic film layers 404 and two reinforcement layers 406 shown. In other examples, fewer or more layers of each of the thermoplastic film layers 404 and reinforcement layers 406 may be included. In some examples, the thermoplastic film layers 404 include polyether ether ketone (PEEK). In other examples, other thermoplastic polymers and/or other materials are used in addition or alternatively to PEEK. PEEK can withstand high surface temperature, is mechanically resilient, has high heat distortion temperatures, and is resistant to solvents. In some examples, the reinforcement layers 406 include a carbon fiber such as, for example, carbon fiber reinforced plastic (CFRP). In other examples, other carbon fibers and/or other materials are used in addition or alternatively to CFRP. Carbon fibers are light materials that provide firm structural properties. Laminating PEEK with high thermally conductive materials like carbon fiber increases the thermal conductivity of the laminate layer 402, which enable an extended usage of this material.

The layering 400 also includes a carbon nanotube (CNT) graphene layer 408. The laminate layer 402 with the CNT graphene layer 408 improves the thermal conductivity of the layering 400. For example, the thermal conductivity may be improved up to, for example, 65-70 W/mK. In some examples, this is an improvement of about ten times over the thermal conductivity of a plain CFRP material. In addition, the laminate layer 402 with the CNT graphene layer 408 is 100% sustainable.

The layer 400 also includes an aluminum layer 410. Anodization on the aluminum layer 204 coated on the laminate layer 402. The anodized aluminum layer 410 provides a metal appearance and a premium aesthetic. In some examples, the aluminum layer 410 is about 5 microns thick. In other examples, the aluminum layer is about 5 microns to about 20 microns thick. In some examples, the aluminum layer has a thickness less than 5 microns. In some examples, the aluminum layer has a thickness greater than 20 microns. Other structural features and benefits of anodized aluminum disclosed herein apply in this example with the laminate layer 402.

Figure 5:
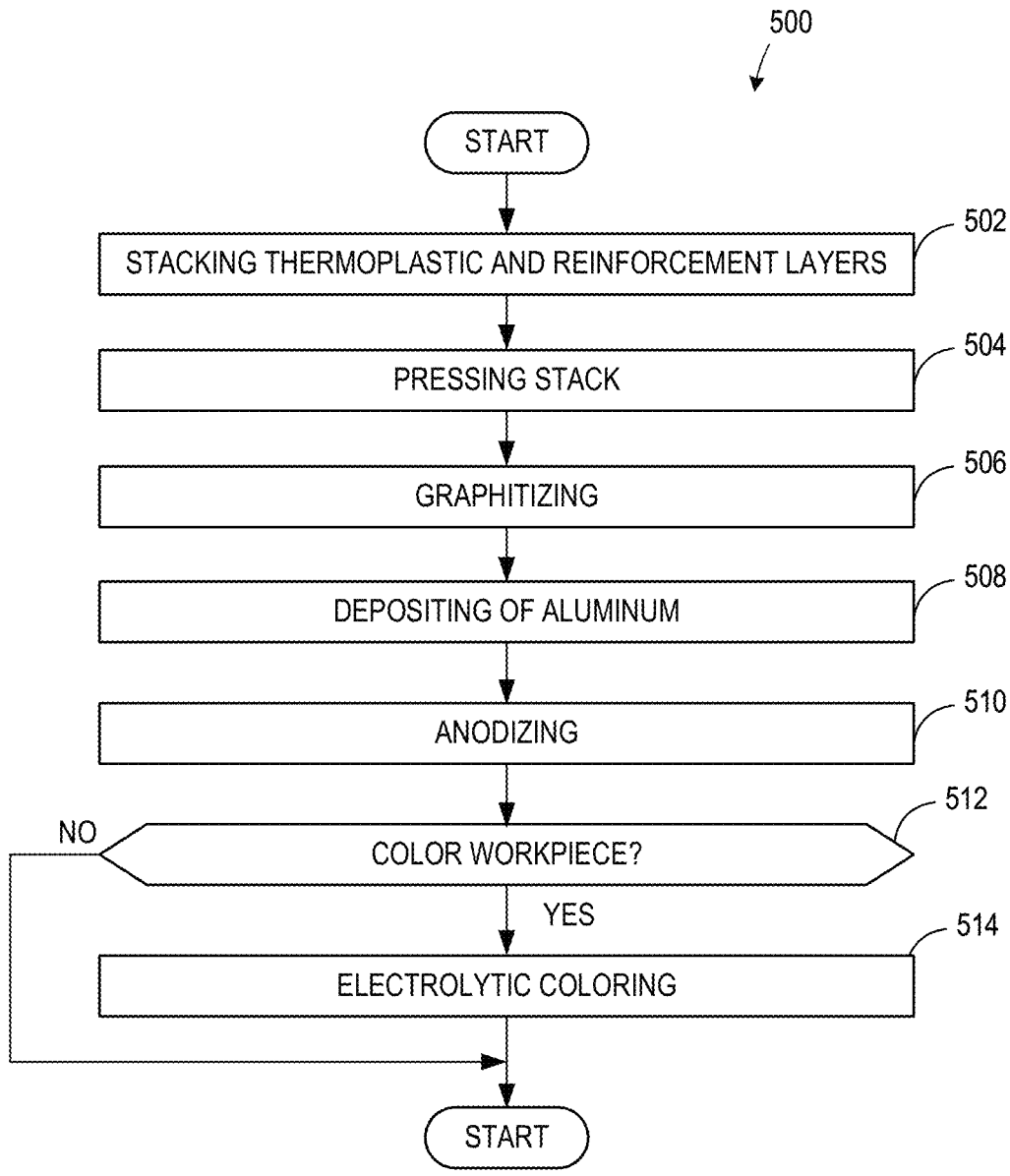
FIG. 5 is a flow chart of an example process of producing an electronic device with the example layers of FIG. 4.

FIG. 5 is a flow chart of an example process 500 of producing or manufacturing an electronic device including the example layering 400 of FIG. 4. The example process 500 includes stacking thermoplastic and reinforcement layers (block 502). For example, the thermoplastic film layers 404 of PEEK and the reinforcement layers 406 of CFRP are stacked to form the laminate layer 402. In some examples, the laminate layer 402 is formed using bidirectional carbon fabric and PEEK films that are stacked alternatively in a mold such as, for example, a steel mold.

The example process 500 includes pressing the stack (block 504). For example, the stack of the thermoplastic film layers 404 of PEEK and the reinforcement layers 406 of CFRP are thermally compressed such as, for example, along a vertical plane. Thermal compression of the stack increases the thermal conductivity of the PEEK and CFRP materials to, for example, 65 W/mK. The pressed layers form a workpiece. In some examples, the carbon fibers are modified poly p-phenylene benzo isoxazole (PBO). Modification with PBO increases the structural reinforcement, impact resistance, friction resistance, and heat resistance of the workpiece.

The process 500 includes graphitizing the workpiece (block 506). The graphitization process coats at least one side of the workpiece with graphene oxide. For example, the CNT graphene layer 408 is added to the laminate 402. In some examples, electrophoresis deposition (EPD) is used for adding graphene oxide. Graphitization improves the in-plane thermal conductivity of the workpiece.

The process 500 includes depositing aluminum (block 508). For example, the aluminum layer 410 is deposited on the laminate layer 402. In some examples, a layer of aluminum that is 20 microns thick is deposited. In other examples, a layer of aluminum of other thicknesses is deposited. In some examples, PVD or magnetron sputtering are used to deposit the aluminum layer as disclosed herein. In other examples, other deposition processes may be used. In some examples, the process includes anodizing the aluminum layer (block 510). Anodization adds a highly visible premium look and feel to the metal chassis. However, in some examples, the carbon fiber natural texture can be kept without carrying out the additional anodization process.

The process 500 includes determining if the workpiece is to be colored (block 512). For example, a controller such as, for example, the processing platform 600 of FIG. 6 determines whether to color the workpiece. If the workpiece is to be colored (block 512: YES), the process 500 includes electrolytic coloring of the workpiece (block 514). In some examples, the workpiece is colored by dip coloring or integral coloring. If the workpiece is not to be colored (block 512: NO) or after coloring the workpiece (block 514), the process 500 ends.

Some advantages of examples disclosed herein include: a sustainable and recyclable electronic device; provision of excellent thermal conductivity compared to current thermoset CFRP chassis; CFRP and PEEK are low density, which in turn reduces weight; and CFRP has resistivity against crack propagation. In addition, examples disclosed herein are recyclable, unlike the prior art designed.

Examples disclosed herein also exhibit structural and material benefits in comparison to prior art designs. For example, there is enhanced pogo load or compression load carrying capacity with the examples of this disclosed. The load experienced by electronic device chassis during normal day-to-day usage, handling, and transportation is called pogo load or compression load. Pogo testing is a type of reliability testing to measure load carrying capacity of chassis. An electronic device with a PEEK and CF chassis (i.e., with the layering 400) improves structural properties such as, for example, elastic modulus and strength. As a result, the pogo load carrying capacity of the PEEK and CF chassis is greater than that of either an aluminum chassis or a magnesium chassis.

Table illustrates material benefits of the PEEK and CF chassis compared to prior designs.

TABLE 3

| Composition | PEEK + Carbon fiber | Epoxy + Carbon fiber | Aluminum alloy 6063 | Aluminum alloy 5052 | Magnesium alloy AZ91D | Polycarbonate/ acrylonitrile butadiene styrene PC + ABS |
|---|---|---|---|---|---|---|
| Elastic modulus (MPa) | 78000 | 210000 | 69000 | 69000 | 45000 | 2410 |

TABLE 3-continued

| Composition | PEEK + Carbon fiber | Epoxy + Carbon fiber | Aluminum alloy 6063 | Aluminum alloy 5052 | Magnesium alloy AZ91D | Polycarbonate/ acrylonitrile butadiene styrene PC + ABS |
|---|---|---|---|---|---|---|
| Yield strength (MPa) | 400 | 945 | 214 | 193 | 160 | 60 |
| Ultimate Strength (MPa) | 425 | 1010 | 241 | 228 | 230 | 80 |
| Density (g/cc) | ~1.5 | 1.5 | 2.7 | 2.68 | 1.81 | 1.18 |
| Thermal Conductivity (W/mK) | 80 | ~5-7 | 180 | 138 | 72.7 | 0.26 |
| Minimum thickness (mm) | 0.5-0.6 | 0.5-0.6 | 0.8 | 0.5-0.6 | 0.8-1 | 1.2 |
| Surface treatment | Anodizing | Painting | Anodizing | Anodizing | Painting | Pre color |
| Recyclable | Yes | No | Yes | Yes | No | Yes |

Examples disclosed herein have other material benefits. For example, with respect to weight reduction, a PEEK and CF chassis gives weight reduction up to, for example, 1.78 times compared to an aluminum chassis. In addition, a PEEK and CF chassis gives weight reduction up to, for example, 1.2 times compared to a magnesium chassis for same chassis thickness. With respect to recyclability, a PEEK and CF chassis is recyclable because thermoplastic PEEK polymer is used as a resin in composite. With respect to surface finish, aluminum deposition followed by an anodization process on PEEK and CF laminate provides a premium finish and has color stability.

Further, although the example processes are described with reference to the flowchart(s) illustrated in FIGS. 3 and 5, many other methods may alternatively be used. For example, the order of execution of the blocks of the flowchart(s) may be changed, and/or some of the blocks described may be changed, eliminated, or combined.

Figure 6:
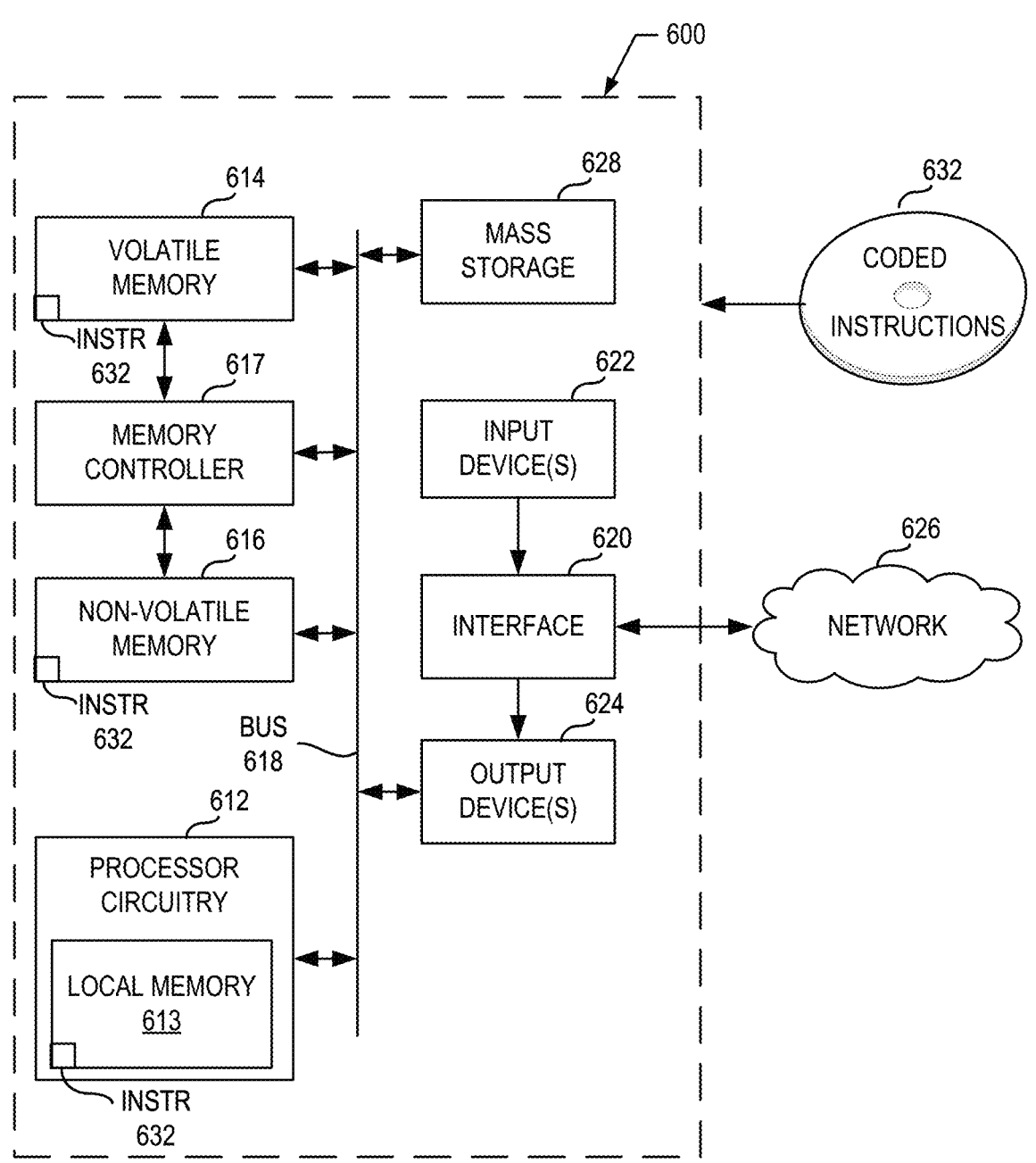
FIG. 6 is a block diagram of an example processing platform including programmable circuitry structured to execute, instantiate, and/or perform the example machine readable instructions and/or control machinery to perform the example operations of FIGS. 3 and 5.

FIG. 6 is a block diagram of an example programmable circuitry platform 600 structured to execute and/or instantiate the example machine-readable instructions and/or control one or more machines and/or machine parts to perform the example operations of FIGS. 3 and/or 5. The programmable circuitry platform 600 can be, for example, a server, a personal computer, a workstation, a self-learning machine (e.g., a neural network), a mobile device (e.g., a cell phone, a smart phone, a tablet such as an iPad™), a personal digital assistant (PDA), an Internet appliance, a DVD player, a CD player, a digital video recorder, a Blu-ray player, a gaming console, a personal video recorder, a set top box, a headset (e.g., an augmented reality (AR) headset, a virtual reality (VR) headset, etc.) or other wearable device, or any other type of computing and/or electronic device.

The programmable circuitry platform 600 of the illustrated example includes programmable circuitry 612. The programmable circuitry 612 of the illustrated example is hardware. For example, the programmable circuitry 612 can be implemented by one or more integrated circuits, logic circuits, FPGAs, microprocessors, CPUs, GPUs, DSPs, and/or microcontrollers from any desired family or manufacturer. The programmable circuitry 612 may be implemented by one or more semiconductor based (e.g., silicon based) devices.

The programmable circuitry 612 of the illustrated example includes a local memory 613 (e.g., a cache, registers, etc.). The programmable circuitry 612 of the illustrated example is in communication with main memory 614, 616, which includes a volatile memory 614 and a non-volatile memory 616, by a bus 618. The volatile memory 614 may be implemented by Synchronous Dynamic Random Access Memory (SDRAM), Dynamic Random Access Memory (DRAM), RAMBUS® Dynamic Random Access Memory (RDRAM®), and/or any other type of RAM device. The non-volatile memory 616 may be implemented by flash memory and/or any other desired type of memory device. Access to the main memory 614, 616 of the illustrated example is controlled by a memory controller 617. In some examples, the memory controller 617 may be implemented by one or more integrated circuits, logic circuits, microcontrollers from any desired family or manufacturer, or any other type of circuitry to manage the flow of data going to and from the main memory 614, 616.

The programmable circuitry platform 600 of the illustrated example also includes interface circuitry 620. The interface circuitry 620 may be implemented by hardware in accordance with any type of interface standard, such as an Ethernet interface, a universal serial bus (USB) interface, a Bluetooth® interface, a near field communication (NFC) interface, a Peripheral Component Interconnect (PCI) interface, and/or a Peripheral Component Interconnect Express (PCIe) interface.

In the illustrated example, one or more input devices 622 are connected to the interface circuitry 620. The input device(s) 622 permit(s) a user (e.g., a human user, a machine user, etc.) to enter data and/or commands into the programmable circuitry 612. The input device(s) 622 can be implemented by, for example, an audio sensor, a microphone, a camera (still or video), a keyboard, a button, a mouse, a touchscreen, a trackpad, a trackball, an isopoint device, and/or a voice recognition system.

One or more output devices 624 are also connected to the interface circuitry 620 of the illustrated example. The output device(s) 624 can be implemented, for example, by display devices (e.g., a light emitting diode (LED), an organic light emitting diode (OLED), a liquid crystal display (LCD), a cathode ray tube (CRT) display, an in-place switching (IPS) display, a touchscreen, etc.), a tactile output device, a printer, and/or speaker. The interface circuitry 620 of the illustrated example, thus, typically includes a graphics driver card, a graphics driver chip, and/or graphics processor circuitry such as a GPU.

The interface circuitry 620 of the illustrated example also includes a communication device such as a transmitter, a receiver, a transceiver, a modem, a residential gateway, a wireless access point, and/or a network interface to facilitate exchange of data with external machines (e.g., computing devices of any kind) by a network 626. The communication can be by, for example, an Ethernet connection, a digital subscriber line (DSL) connection, a telephone line connection, a coaxial cable system, a satellite system, a beyond-line-of-site wireless system, a line-of-site wireless system, a cellular telephone system, an optical connection, etc.

The programmable circuitry platform 600 of the illustrated example also includes one or more mass storage discs or devices 628 to store firmware, software, and/or data. Examples of such mass storage discs or devices 628 include magnetic storage devices (e.g., floppy disk, drives, HDDs, etc.), optical storage devices (e.g., Blu-ray disks, CDs, DVDs, etc.), RAID systems, and/or solid-state storage discs or devices such as flash memory devices and/or SSDs.

The machine-readable instructions 632, which may be implemented by the machine readable instructions to effect the operations of FIGS. 3 and 5, may be stored in the mass storage device 628, in the volatile memory 614, in the non-volatile memory 616, and/or on at least one non-transitory computer readable storage medium such as a CD or DVD which may be removable.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc., may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, or (7) A with B and with C. As used herein in the context of describing structures, components, items, objects and/or things, the phrase "at least one of A and B" is intended to refer to implementations including any of (1) at least one A, (2) at least one B, or (3) at least one A and at least one B. Similarly, as used herein in the context of describing structures, components, items, objects and/or things, the phrase "at least one of A or B" is intended to refer to implementations including any of (1) at least one A, (2) at least one B, or (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, or (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, or (3) at least one A and at least one B.

As used herein, singular references (e.g., "a", "an", "first", "second", etc.) do not exclude a plurality. The term "a" or "an" object, as used herein, refers to one or more of that object. The terms "a" (or "an"), "one or more", and "at least one" are used interchangeably herein. Furthermore, although individually listed, a plurality of means, elements, or actions may be implemented by, e.g., the same entity or object. Additionally, although individual features may be included in different examples or claims, these may possibly be combined, and the inclusion in different examples or claims does not imply that a combination of features is not feasible and/or advantageous.

As used in this patent, stating that any part (e.g., a layer, film, area, region, or plate) is in any way on (e.g., positioned on, located on, disposed on, or formed on, etc.) another part, indicates that the referenced part is either in contact with the other part, or that the referenced part is above the other part with one or more intermediate part(s) located therebetween.

As used herein, connection references (e.g., attached, coupled, connected, and joined) may include intermediate members between the elements referenced by the connection reference and/or relative movement between those elements unless otherwise indicated. As such, connection references do not necessarily infer that two elements are directly connected and/or in fixed relation to each other. As used herein, stating that any part is in "contact" with another part is defined to mean that there is no intermediate part between the two parts.

As used herein, "processor circuitry" is defined to include (i) one or more special purpose electrical circuits structured to perform specific operation(s) and including one or more semiconductor-based logic devices (e.g., electrical hardware implemented by one or more transistors), and/or (ii) one or more general purpose semiconductor-based electrical circuits programmable with instructions to perform specific operations and including one or more semiconductor-based logic devices (e.g., electrical hardware implemented by one or more transistors). Examples of processor circuitry include programmable microprocessors, Field Programmable Gate Arrays (FPGAs) that may instantiate instructions, Central Processor Units (CPUs), Graphics Processor Units (GPUs), Digital Signal Processors (DSPs), XPUs, or microcontrollers and integrated circuits such as Application Specific Integrated Circuits (ASICs). For example, an XPU may be implemented by a heterogeneous computing system including multiple types of processor circuitry (e.g., one or more FPGAs, one or more CPUs, one or more GPUs, one or more DSPs, etc., and/or a combination thereof) and application programming interface(s) (API(s)) that may assign computing task(s) to whichever one(s) of the multiple types of processor circuitry is/are best suited to execute the computing task(s).

Unless specifically stated otherwise, descriptors such as "first," "second," "third," etc., are used herein without imputing or otherwise indicating any meaning of priority, physical order, arrangement in a list, and/or ordering in any way, but are merely used as labels and/or arbitrary names to distinguish elements for ease of understanding the disclosed examples. In some examples, the descriptor "first" may be used to refer to an element in the detailed description, while the same element may be referred to in a claim with a different descriptor such as "second" or "third." In such instances, such descriptors are used merely for identifying those elements distinctly within the context of the discussion (e.g., within a claim) in which the elements might, for example, otherwise share a same name.

As used herein, "approximately" and "about" modify their subjects/values to recognize the potential presence of variations that occur in real world applications. For example, "approximately" and "about" may modify dimensions that may not be exact due to manufacturing tolerances and/or other real-world imperfections as will be understood by persons of ordinary skill in the art. For example, "approximately" and "about" may indicate such dimensions may be within a tolerance range of +/−10% unless otherwise specified in the below description.

Examples disclosed herein are suitable for cosmetic application and/or decoration of chassis in thin and light gaming devices by bringing in additional thin layer of aluminum. Known laptops and other gaming devices use stamped aluminum and plastic bonding only in D-covers and not in A, B, and/or C covers. In examples disclosed herein, the material and related manufacturing techniques are highly suitable not only for D-cover but also across chassis material including A, B, C, and/or D covers.

Example systems, apparatus, articles of manufacture, and methods are disclosed related to composite materials for electronic device chassis. Example 1 includes an example electronic device includes a chassis including a layer of a magnesium alloy or a layer of polyether ether ketone and carbon fiber reinforced plastic and an anodized aluminum coating.

Example 2 includes the electronic device of Example 1, wherein the chassis is paint-free.

Example 3 includes the electronic device of either Examples 1 or 2, wherein the chassis has a non-reflective surface.

Example 4 includes the electronic device of any of Examples 1-3, wherein the anodized aluminum coating is porous.

Example 5 includes the electronic device of any of Examples 1-4, wherein the chassis has a density of 1.81 grams per cubic centimeter.

Example 6 includes the electronic device of any of Examples 1-5, wherein the electronic device is a laptop computer including four covers, the chassis forming at least three of the four covers.

Example 7 includes the electronic device of any of Examples 1-6, wherein the anodized aluminum coating has a thickness of between about 5 microns and about 20 microns.

Example 8 includes a method of forming a chassis for an electronic device, the method including diecasting a magnesium alloy into a die to form a workpiece; applying computer numerical control machining to the workpiece; polishing the workpiece; applying chromate conversion to at least a portion of the workpiece; depositing aluminum on the workpiece; and anodizing the aluminum.

Example 9 includes the method of Example 8, further including using vapor deposition to deposit the aluminum.

Example 10 includes the method of either Examples 8 or 9, further including electrolytic coloring of the workpiece.

Example 11 includes the method of any of Examples 8-10, further including applying an alkaline solution before depositing the aluminum.

Example 12 includes the method of any of Examples 8-11, further including bead blasting the workpiece before applying the chromate conversion.

Example 13 includes the method of any of Examples 8-12, wherein the chromate conversion is hex-free.

Example 14 includes a method of forming a chassis for an electronic device, the method including stacking carbon fibers and polyether ether ketone to form a workpiece; depositing aluminum on the workpiece; and anodizing the aluminum.

Example 15 includes the method of Example 14 further including thermally compressing the workpiece before depositing the aluminum.

Example 16 includes the method of either of Examples 14 or 15 further including coating the workpiece with graphene oxide.

Example 17 includes the method of Example 16 further including using electrophoresis deposition to coat the workpiece with graphene.

Example 18 includes the method of any of Examples 14-17 further including modifying the carbon fibers with poly p-phenylene benzo isoxazole.

Example 19 includes the method of any of Examples 14-18, wherein depositing the aluminum includes depositing 5-20 microns of aluminum.

Example 20 includes the method of any of Examples 14-19 further including using magnetron sputtering to deposit the aluminum.

The following claims are hereby incorporated into this Detailed Description by this reference. Although certain example systems, apparatus, articles of manufacture, and methods have been disclosed herein, the scope of coverage of this patent is not limited thereto. On the contrary, this patent covers all systems, apparatus, articles of manufacture, and methods fairly falling within the scope of the claims of this patent.

What is claimed is:

1. A method of forming a chassis for an electronic device, the method comprising:
    diecasting a magnesium alloy to form a workpiece;
    applying computer numerical control machining to the workpiece;
    polishing the workpiece;
    applying a chromate conversion coating to at least a portion of the workpiece;
    depositing aluminum on the workpiece over the chromate conversion coating; and
    anodizing the aluminum.

2. The method of claim 1, including using vapor deposition to deposit the aluminum.

3. The method of claim 1, including electrolytic coloring of the workpiece.

4. The method of claim 1, including applying an alkaline solution before depositing the aluminum.

5. The method of claim 1, including bead blasting the workpiece before applying the chromate conversion.

6. The method of claim 1, wherein the chromate conversion coating is hex-free.

7. The method of claim 1, wherein the applying of the chromate conversion coating to the portion of the workpiece includes applying the chromate conversion coating on areas of the workpiece that are to exhibit electrical conductivity and corrosion-resistance at the same time.

8. The method of claim 1, wherein the anodizing of the aluminum occurs after the applying of the chromate conversion coating.

9. The method of claim 2, wherein the depositing of the aluminum includes:
    evaporating the aluminum in a physical vapor deposition chamber; and
    embedding the aluminum into pores of a surface of the workpiece.

10. The method of claim 3, wherein the electrolytic coloring the workpiece includes causing absorption of at least one of dyes, salts, or pigments into the aluminum.

11. The method of claim 1 wherein the method does not utilize paint and the workpiece is paint-free.

* * * * *